(12) United States Patent
Fuergut et al.

(10) Patent No.: US 10,037,972 B2
(45) Date of Patent: Jul. 31, 2018

(54) ELECTRONIC MODULE COMPRISING FLUID COOLING CHANNEL AND METHOD OF MANUFACTURING THE SAME

(71) Applicant: Infineon Technologies AG, Neubiberg (DE)

(72) Inventors: Edward Fuergut, Dasing (DE); Martin Gruber, Schwandorf (DE); Wolfram Hable, Neumarkt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/137,062

(22) Filed: Apr. 25, 2016

(65) Prior Publication Data

US 2016/0322333 A1     Nov. 3, 2016

(30) Foreign Application Priority Data

Apr. 28, 2015   (DE) .................. 10 2015 106 552

(51) Int. Cl.
*H01L 23/34* (2006.01)
*H01L 25/065* (2006.01)
(Continued)

(52) U.S. Cl.
CPC ...... *H01L 25/0657* (2013.01); *H01L 23/3121* (2013.01); *H01L 23/473* (2013.01); *H01L 24/32* (2013.01); *H01L 24/40* (2013.01); *H01L 24/48* (2013.01); *H01L 24/73* (2013.01); *H01L 24/83* (2013.01); *H01L 24/84* (2013.01); *H01L 24/85* (2013.01); *H01L 24/92* (2013.01); *H01L 25/074* (2013.01); *H01L 25/50* (2013.01);
(Continued)

(58) Field of Classification Search
CPC ......... H01L 24/84; H01L 24/92; H01L 24/73; H01L 24/85; H01L 24/40; H01L 24/48; H01L 24/83; H01L 24/45; H01L 25/0657; H01L 25/074; H01L 23/5226; H01L 23/473

See application file for complete search history.

(56) References Cited

U.S. PATENT DOCUMENTS

2010/0090335 A1    4/2010 Chung
2010/0275971 A1*  11/2010 Zingher ................. H02S 10/00
                                                        136/246
(Continued)

FOREIGN PATENT DOCUMENTS

CN        102870211 A      1/2013
DE        10035170 A1      2/2002
(Continued)

OTHER PUBLICATIONS

Applikationshandbuch Leistungshalbleiter.
English translation of Abstract for CN 102870211 A.

*Primary Examiner* — Hoa B Trinh

(57) ABSTRACT

Various embodiments provide an electronic module comprising a interposer comprising a fluid channel formed in an electrically isolating material and an electrically conductive structured layer; at least one electronic chip attached to the electrically conductive layer and in thermal contact to the fluid channel; and a molded encapsulation formed at least partially around the at least one electronic chip, wherein the electrically conductive structured layer is directly formed on the electrically isolating material.

13 Claims, 5 Drawing Sheets

(51) Int. Cl.
    *H01L 23/31*     (2006.01)
    *H01L 23/473*     (2006.01)
    *H01L 23/00*     (2006.01)
    *H01L 25/07*     (2006.01)
    *H01L 25/00*     (2006.01)
    *H01L 23/40*     (2006.01)

(52) U.S. Cl.
    CPC ........ *H01L 24/45* (2013.01); *H01L 2023/405* (2013.01); *H01L 2023/4031* (2013.01); *H01L 2023/4087* (2013.01); *H01L 2224/023* (2013.01); *H01L 2224/27464* (2013.01); *H01L 2224/29082* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29184* (2013.01); *H01L 2224/32225* (2013.01); *H01L 2224/40225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/73263* (2013.01); *H01L 2224/73265* (2013.01); *H01L 2224/8384* (2013.01); *H01L 2224/8385* (2013.01); *H01L 2224/83801* (2013.01); *H01L 2224/84205* (2013.01); *H01L 2224/84801* (2013.01); *H01L 2224/85205* (2013.01); *H01L 2224/85801* (2013.01); *H01L 2224/92246* (2013.01); *H01L 2224/92247* (2013.01); *H01L 2225/0651* (2013.01); *H01L 2225/06572* (2013.01); *H01L 2225/06589* (2013.01); *H01L 2924/00014* (2013.01); *H01L 2924/05432* (2013.01); *H01L 2924/05442* (2013.01); *H01L 2924/1033* (2013.01); *H01L 2924/10272* (2013.01); *H01L 2924/1203* (2013.01); *H01L 2924/1304* (2013.01); *H01L 2924/1426* (2013.01); *H01L 2924/1431* (2013.01); *H01L 2924/186* (2013.01); *H01L 2924/19041* (2013.01); *H01L 2924/19042* (2013.01); *H01L 2924/19043* (2013.01); *H01L 2924/19101* (2013.01); *H01L 2924/401* (2013.01)

(56) References Cited

U.S. PATENT DOCUMENTS

2013/0032230 A1     2/2013     Olesen et al.
2014/0332950 A1     11/2014     Iwata et al.

FOREIGN PATENT DOCUMENTS

DE     102008001230 A1     10/2008
DE     102009002519 A1     10/2010

* cited by examiner

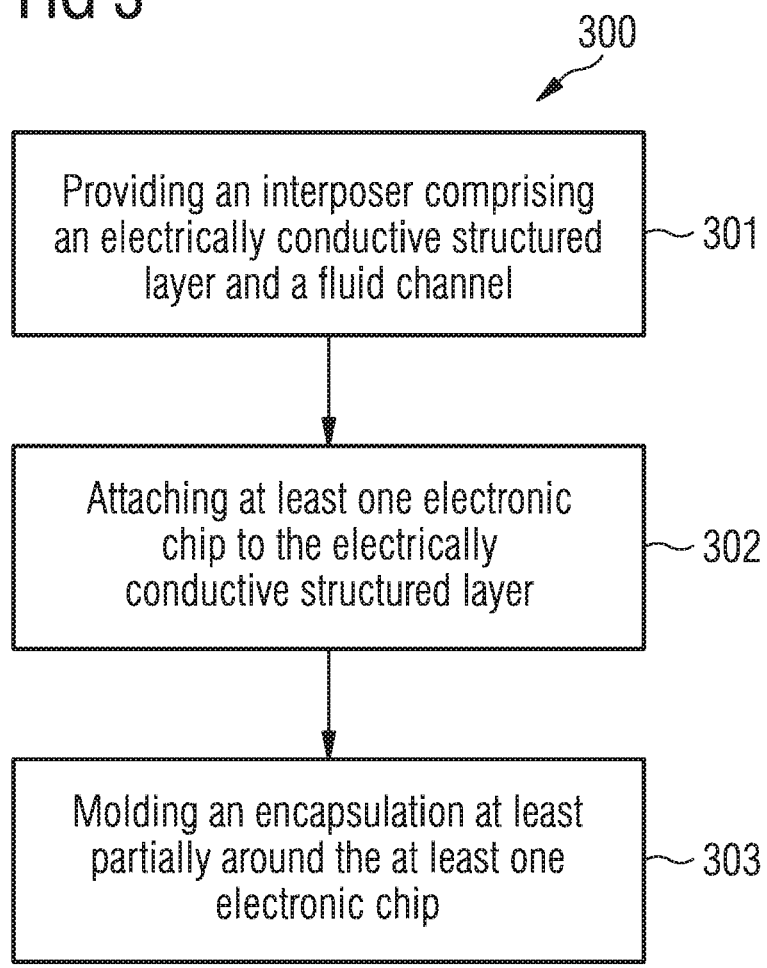

ELECTRONIC MODULE COMPRISING FLUID COOLING CHANNEL AND METHOD OF MANUFACTURING THE SAME

TECHNICAL FIELD

Various embodiments relate to an electronic module comprising a fluid cooling channel, and a method of manufacturing the same.

BACKGROUND

In the field electronic modules housed electronic chips are widely used. Due to the housing the waste heat generated by the housed electronic chip are often an important limiting factor so that a cooling has to be provided. Often so-called heat sinks are used to discharge the waste heat.

From WO 2012/076552 a liquid-cooled heat sink is known including a top plate having an array of circuitous liquid channels, each channel having a separate channel inlet and a common central outlet channel. The heat sink further includes a bottom plate having an inlet port and an outlet port. The heat sink further includes an intermediate plate having inlet guide channels providing fluid communication between the inlet port of the bottom plate and channel inlets of the top plate, said intermediate plate further including an outlet guide channel providing fluid communication between the common central outlet channel of the top plate and the outlet port of the bottom plate.

SUMMARY

Various embodiments provide an electronic module comprising an interposer comprising a fluid channel formed in an electrically isolating material and an electrically conductive structured layer; at least one electronic chip attached to the electrically conductive layer and in thermal contact to the fluid channel; and a molded encapsulation formed at least partially around the at least one electronic chip, wherein the electrically conductive structured layer is directly formed on the electrically isolating material.

Furthermore, various embodiments provide a method of manufacturing an electronic module, wherein the method comprises providing an interposer comprising a fluid channel formed in an electrically isolating material and an electrically conductive structured layer, wherein the electrically conductive structured layer is directly formed on the electrically isolating material; attaching at least one electronic chip to the electrically conductive structured layer and in thermal contact to the fluid channel; and molding an encapsulation at least partially around the at least one electronic chip.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIG. 3 illustrates a flowchart of a method of manufacturing an electronic module according to an exemplary embodiment;

DETAILED DESCRIPTION

Figure 1A:
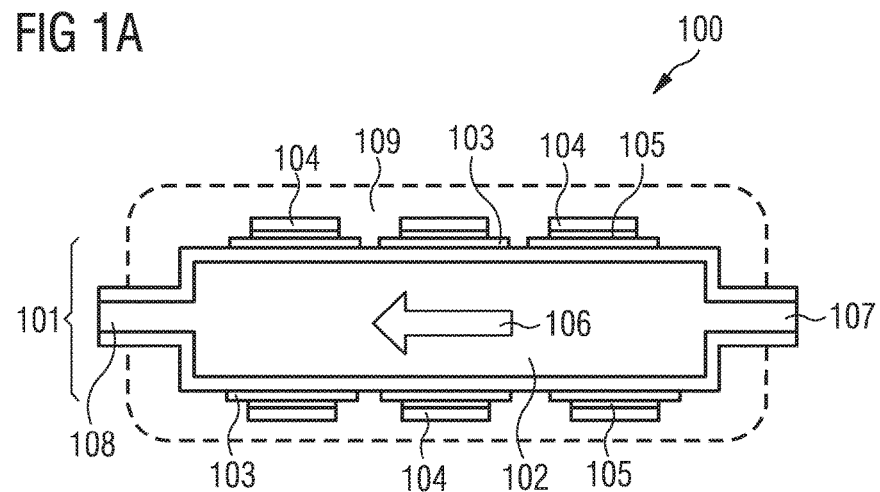
FIG. 1A schematically shows a cross sectional view of an electronic module according to an exemplary embodiment.

In the following further exemplary embodiments of an electronic module, and a method of manufacturing an electronic module are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide an electronic module, in particular an electronic power module, comprising an interposer comprising a body formed of electrically isolating material and having embedded therein at least one fluid channel and an electrically conductive structured layer formed directly thereon. To the electrically conductive structured layer of the interposer at least one or a plurality of electronic chips or semiconductor chips is attached, e.g. by bonding (copper or aluminum for example) soldering, either directly or indirectly. The at least one electronic chip is in thermal contact to the fluid channel so that heat generated by the at least one electronic chips can be discharged or led away. Furthermore, the at least one electronic chip is at least partly or completely encapsulated by a molded encapsulation.

In particular, only one fluid channel may be provided in the interposer, and may have a meandering form or shape or may be a single cavity or hollow space. In particular, the fluid channel may be formed directly in a body of the interposer and not form another element or unit attached to the interposer. That is, walls (sidewalls and/or bottom and/or top walls) defining the fluid channel may be part of the interposer, in particular the body of the interposer formed by the electrically isolating material. Furthermore it should be mentioned that a plurality of interposer may be stacked on each other. In particular, the electronic module may comprise a stack of several interposer or even a plurality of electronic modules may be stacked on each other.

It should be noted that in principle no limitations with respect to the used electronic or semiconductor chips may be given, e.g. with respect to the used semiconductor materials (like gallium nitride (GaN) or silicon carbide (SiC)). This may be the case since the electronic chips may be embedded into the molded encapsulation and further the fluid channel may be formed in an electrically isolating base material which protects the electronic chip from a direct contact with the cooling fluid. Furthermore, the electronic module may comprise a plurality of electronic chips or dies.

Due to the high heat capacitance or heat conductivity of the (cooling) fluid it may even be possible to implement high power electronic chips in small encapsulated electronic modules or packages so that a high power density may be achievable. Alternatively the efficiency of the overall electronic module may be increased due to the possibility to switch higher power. The molded encapsulation may as well form an improved protection against mechanical stress or breaking compared to a ceramic and/or metal housing.

In particular, it should be mentioned that the molded encapsulation is formed directly to the interposer and has to be distinguished from a pre-fabricated housing which is then arranged around an electronic chip. For example, the molded encapsulation may define the outer perimeter or silhouette of the electronic module. In particular, molding materials withstanding high temperatures may be used. For example, typical molding compounds like epoxy resin, bismaleimide, polyimide, cyan ester or the like may be used. Furthermore, filler material may be included in the encapsulant or encapsulation material, e.g. epoxy and/or silicone.

In particular, the electronic module may be an electronic power module. For example, the at least one electronic chip may be a (power) transistor, a (power) diode or any other kind of electronic chip or die.

It should be noted that no additional, e.g. organic, intermediate layers, may be necessary to attach the at least one electronic chip to the interposer or to thermally coupling electronic chip(s) to the cooling feature of the fluid channel and in particular to an electrically conductive structured layer. Such organic layers are often used in common (packaged) electronic modules. However, the possible omitting of such organic layers may be helpful in order to improve the performance, since such organic layers often cause great variations concerning thermal conductivity, may cause high thermal resistance which may limit the life time of the electronic module and/or may increase the volume necessary for the electronic module. While such organic layers may exhibit good performance at the start they often age quite fast which leads to an increase of the speed of degradation over time (increasing of resistance leads to an increased heat production leads to an increased resistance and so on). This aging effect may even be more important in cases "high temperature" semiconductors (like gallium nitride (GaN) or silicon carbide (SiC)) may be used. In particular, only an optional bonding layer may be placed between the interposer and the electronic chip.

In particular, the structured layer may be an electrically conductive layer structured by a subtractive process like etching. Furthermore, the electrically conductive structured layer may be printed directly on the isolating material, e.g. by printing a copper layer onto the isolating material. In case of a ceramic material as a base material of the interposer, the ceramic material may form or define the fluid channel. Thus, the electrically conductive material forming the structured layer may be electrically isolated from the fluid channel by the ceramic material.

Due to the good heat discharging capability of a fluid, e.g. water, oil, isolating liquids, gases or air, it may be possible to provide a very compact electronic module or to provide a rather small electronic module for a given performance, e.g. power capacity. That is, the power capacity per volume (which is a limiting factor in the automotive sector for example) may be increased. In particular, the temperature of the electronic module may be kept at a lower level which may increase the efficiency of the electronic module. The increase of the efficiency in turn may enable that the number of necessary electronic modules for a given application can be reduced. In addition it may be possible to use the heat energy led away by the cooling fluid for other purposes. For example, in case of an electric car where such a module is used, the waste head may be used for heating the car or the battery in winter or the like.

Furthermore, limitations to the material used for the encapsulation may be eased due to the fact that the heat is discharged via the fluid. Thus, no heat conductive areas for increasing heat capacity and/or heat conductivity, like a metal plate or the like, for a thermal contact between the electronic module and a surrounding environment where the electronic module is used in or fixed to may be necessary. However, it should be mentioned that an additional heat conductive or discharging path may be given, e.g. via a lead frame, or heat conductive spacers arranged on or in thermal contact to the front side and/or backside of the electronic chip. Such a surrounding environment may be an automobile or the like where (power) electronic modules may be used.

Furthermore, the electronic module comprising the (cooling) fluid channel may be beneficial used in environments or applications where already a fluid cooling system is used, to which the fluid channel may be easily connected to. Thus, no extra pump for pumping the fluid through the fluid may be necessary. However, alternatively or additionally a pump dedicated specifically for the fluid of the fluid channel in the interposer may be provided.

By providing an electronic module including a fluidic cooling and being encapsulated by a mold a compact module having a low complexity may be provided. In particular, when using such a module some of the functions (e.g. cooling function), which are typically performed or taken care of by the application the module is used in, is taken over by the module. For example, in case such a module is used in the automotive field the manufacturer of the car does not have to take care of heat dissipation features and/or isolating features (aside from the provision and discharging of cooling fluid). In some sense the electronic module is similar to a "plug and play" module.

In the following exemplary embodiments of the electronic module are described. However, the features and elements described with respect to these embodiments can be combined with exemplary embodiments of the methods of manufacturing an electronic module.

According to an exemplary embodiment of the electronic module the interposer comprises a ceramic material.

In particular, the ceramic material (like aluminum oxide aluminum nitride, silicon nitride, aluminum titanate, zirconium oxide, or silicate) may be a base material of the interposer. For example, the fluid channel may be formed or defined by the ceramic material. That is, the walls of the fluid channel may be formed by the ceramic material. Preferably, the ceramic material is an electrically isolating material. In particular, the ceramic material may be a sinterable material.

According to an exemplary embodiment of the electronic module the ceramic material is sintered.

According to an exemplary embodiment of the electronic module the electrically conductive structured layer comprises a metal and is sintered together with the ceramic material.

In particular, the metal may be copper. For example, a copper foil may be attached which is then structured by etching and then bonded afterwards. Alternatively, the metallic structured layer may be printed (by using a metallic paste) and sintered afterwards. A further alternative process may be the use of a 3D "printing" or generating technique, e.g. using a laser to directly forming conductive structures (which may as well be sintered already by the laser) from a metallic powder. By sintering the metal material together with ceramic material a connection or joint between the two materials may exhibit a great strength, i.e. both materials may stick together with a great adhering force. In principle both components may form afterwards a single composite or compound.

It should be noted that of course additional or refinement layers may be deposited or arranged on the metallic structured layer. For example, a nickel layer, a palladium layer, a silver layer, gold layer and/or tungsten layer may be deposited by an electroless plating process, for example.

Furthermore, it may be possible to provide a structured layer having a pore size of about 5 micrometer to 30 micrometer. Such a pores size may be suitable to minimize mechanical stress e.g. between the active electronic device or chip and the copper layer of the interposer due to changes in temperature (e.g. during power cycles). Therefore, the electronic module may exhibit an improved reliability and/or an increased life time.

According to an exemplary embodiment the electronic module further comprises a further electronic chip, wherein the at least one electronic chip is arranged on a first main surface of the interposer and the further electronic chip is arranged on a second main surface of the interposer.

In particular, the first main surface and the second main surface may be on opposite sides of the interposer. It should be noted that for each main surface a separate electrically conductive structured layer and/or lead frame may be provided. That is, the interposer may comprise a further electrically conductive structured layer (one for each main surface). Furthermore, also on other sides or surfaces of the interposer additional electrically conductive structured layers may be provided.

It should be noted that of course a plurality of electronic chips may be arranged on one or each of the main surfaces or structured layers. It should be noted that the electronic chips may be of different type or of the same type. For example, some chips may be power transistors or power diodes while other electronic chips may comprise logic components, like drivers (e.g. gate drivers), configured for controlling the electronic module or parts thereof, for example.

According to an exemplary embodiment of the electronic module the at least one electronic chip is attached to the electrically conductive structure layer by a sintering process.

For example, the attaching may be performed by a pressure-less sinter process based on a specific paste for such a pressure-less sinter process. The electronic chip may be bonded directly to the interposer or the chip carrier. For example, the electrically conductive structured layer may be a copper or silver layer. Alternatively or additional the attaching may be performed by an (any suitable) adhesive material or layer, and/or soldering process, e.g. a diffusive soldering.

According to an exemplary embodiment the electronic module further comprises an external electrical contact connected to the electrically conductive structured layer and being partially embedded into the molded encapsulation.

Such an external electrical contact may be a lead frame or pin or the like. A lead frame may be (aside from providing electrical connection for the electronic module) as well used for handling and encapsulating the electronic module. However, it should be noted that the external electrical contact may be soldered to the electrically conductive structured layer and may be (partially) kept free of material of the molded encapsulation.

According to an exemplary embodiment of the electronic module the electrically conductive structured layer is connected to the external electrical contact by a bonding process selected out of the group consisting of: wire bonding; clip bonding; laser welding, soldering, resistance welding, and ultrasonic welding.

In particular, copper wires and/or aluminum wires and/or gold wires and/or silver wires may be used for the wire bonding. Such a bonded connection may as well provide for a (small) further thermal connection to external structures or the environment via the lead frame. However, the amount of (waste) heat energy discharged via this further thermal path may depend on the dimensions (or size) of the lead frame and the bonding. For example, the bonding structures, the lead frame and/or structured layer each may comprise portions of different dimensions or dimensioning. For example, some portions or sections may be formed by relatively thick and/or wide structures so that rather high electrical currents may be transferable. In addition other portions may be formed by relatively thin and/or narrow structures and may primarily be used for low currents, e.g. logic signals.

According to an exemplary embodiment of the electronic module the molded encapsulation comprises surface structures configured to fix or mount the electronic module to an external structure.

In particular, one or a plurality of surface structures may be formed or provided on an outer perimeter of the molded encapsulation. Such a surface structure may particularly enable an easy attachment or fixing of the molded encapsulation to external structures. In this context the use of a molded encapsulation (forming the outer perimeter of the electronic module) may be particularly helpful to provide a great variety of shapes or forms adapted to very different external structures. In particular, the use of such surface or fixing structures may have the benefit that no extraordinary pressure may have to be applied when mounting the electronic module to an external structure.

In particular, the use of fluid cooling channel connectable to an external fluid channel or tube may enable to fix the electronic module at any desired point of the external structures, in particular since it may not be necessary to provide a good thermal contact to the external structure at the point of fixing or attaching (e.g. by using a great contact surface between the electronic module and the external structure and/or providing a material having a high thermal conductivity).

According to an exemplary embodiment of the electronic module the surface structure has a form selected out of the group consisting of: a groove; tongue; screw hole; rivet; screw; and recess.

In general the surface structure may have any form which is suitable to provide a form or positive fit with a matching or complementary surface structure formed in or on an external structure or element the electronic module shall be attached to. Such surface structures may be relatively easily formed when using a molding compound for the encapsulation, since typical molding compounds or materials may be more break-proof than ceramic compounds sometimes used as materials for manufacturing housings for commonly known electronic modules. Even in case the interposer may comprise or may substantially consists of ceramic material this ceramic material may be protected by the encapsulation formed by a molding compound instead of a ceramic housing.

According to an exemplary embodiment the electronic module further comprises a fixation element embedded in the molded encapsulation.

In particular, the fixation element may be a nut, a screw or alike which is embedded by molding material and which may be configured to be fixed or mounted on a complementary fixation element external to the electronic module.

According to an exemplary embodiment of the electronic module the fluid channel comprises an input terminal and an output terminal.

In particular, the input terminal and the output terminal may be connectable to a fluid channel external to the electronic module. The input terminal and/or output terminal may be of another material than a base material of the interposer. Thus, the fluid channel may be connectable to an external heat sink or heat dissipation element.

In particular, the fluid channel may be, via the input terminal and output terminal, substantially the only heat dissipation channel or path for (waste) heat generated in the electronic module, e.g. in the electronic (power) chip. Therefore, it may be possible that an outer perimeter of the molded encapsulation is free of any areas or structures (except the input and output terminals) intended to guide heat to an external structure.

For example, no metallic (e.g. copper) pad may be formed on the outside of the molded encapsulation. In particular, the molded encapsulation may have a rather low thermal conductivity or at least no limitation concerning the heat conductivity of the molding material is given. In particular, only one input terminal and one output terminal are provided for the overall interposer. Thus, a connecting to an external structure may be eased.

According to an exemplary embodiment of the electronic module the at least one electronic chip is one out of the group consisting of: power transistor; power diode; and logic components. In particular, the logic component may comprise or may be formed by a logic chip, like a (gate) driver, for example.

According to an exemplary embodiment the electronic module further comprises a passive electric component at least partially embedded in the molded encapsulation.

In particular, the passive electric component may be a coil, a resistance or a capacity. The passive electric component may be attached or bonded to the electrically conductive structured layer as well.

According to an exemplary embodiment of the electronic module the electrically conductive structured layer comprising portions of different dimensions.

In particular, the electrically conductive structured layer may comprise portions relatively thin and/or comprising narrow structures. These portions may be suitable for conducting relative low currents as used for logic signals. Other portions may have a relative greater thickness and/or may comprise wider structures. These portions may be suitable for conducting higher currents.

According to an exemplary embodiment of the electronic module the encapsulation comprises an encapsulant and a filler material.

In particular, the filler material may be oxides like silicon oxide or aluminum oxide, or nitrides like aluminum nitride or bore nitride. By including such fillers into the (base) encapsulation material or encapsulant it may be possible to provide an encapsulation which as well functions as a further heat conductive path for dissipating (waste) heat energy. For example, such an encapsulation may be effective in reducing heat peaks arising during the operation of the at least one electronic chip.

According to an exemplary embodiment the electronic module further comprises a redistribution layer.

In particular, the (galvanic) redistribution layer may be arranged on the at least one electronic chip or preferably to a plurality of electronic chips and may be used to redistribute electrical contacts or terminals in the electronic module, e.g. of electric terminals of the electronic chip. In particular, such a redistribution layer may be useful in case a plurality of electronic chips may be parallel processed, e.g. in a so-called panel or multiblock, which may reduce production costs. In the panel or multiblock the electronic chips may be arranged in an array which may be encapsulated by a first or inner encapsulation, e.g. formed by a mold, laminates, glass, plastic or ceramic compound.

In particular, the electronic module may comprise two layers of encapsulation material, i.e. an inner and an outer encapsulation, wherein the outer encapsulation layer may be the one formed by a molding compound (e.g. silicon or epoxy), while the inner one may be formed by a mold compound or any other suitable material, e.g. ceramics, glass, plastic material, laminates or the like. On or in the inner encapsulation layer a metallization layer and/or vias may be formed on which optional a solder resist layer may be formed.

In the following exemplary embodiments of the method of manufacturing an electronic module are described. However, the features and elements described with respect to these embodiments can be combined with exemplary embodiments of the electronic module.

According to an exemplary embodiment of the method the molding of the encapsulation comprises the forming of surface structures configured to be fixed to an external structure.

According to an exemplary embodiment of the method a plurality of electronic chips are attached to the electrically conductive structured layer and the method further comprises forming an inner encapsulation around the plurality of electronic chips.

In particular, the plurality of electronic chips may form an array and the inner encapsulation layer may form an array encapsulation. Thus, some kind of panel or multiblock may be formed, which may be then afterwards further processed in a batch like manner, e.g. by arranging or contacting a (galvanic) redistribution layer and/or a solder resist layer before a singularization step may be performed to divide or singularize the panel or multiblock and to form thereby a plurality of raw electronic modules which may then be further processed (e.g. by attaching a leadframe and/or forming the outer molded encapsulation thereon) to thus manufacture the electronic modules. It should be noted that one, some or all of the (raw) electronic modules may comprise a plurality of electronic chips or dies.

It should be mentioned that the inner encapsulation may not only be formed around a plurality of electronic chips (e.g. for forming a panel or multiblock) which are singularized afterwards to form a plurality of electronic modules but may as well be formed around a single electronic module or single interposer intended to form a single electronic module afterwards.

According to an exemplary embodiment of the method a plurality of electronic chips are attached to the electrically conductive structured layer and the method further comprises arranging a redistribution layer in electrical contact to the plurality of electronic chips.

In particular, the (galvanic) redistribution layer may be arranged on an inner or panel encapsulation encapsulating the plurality of electronic chips. Optionally further steps like forming a solder resist layer on the redistribution layer and/or a singularization step of the panel, which may singularize the electronic chips or a plurality of raw electronic modules, may be performed. After the singularization step a leadframe or another (carrier) structure may be attached to the singularized electronic module. After that the molding process forming the molded or outer encapsulation may be performed.

In the following specific embodiments of the electronic module and the method of manufacturing an electronic module will be described in more detail with respect to the figures. Some of the described embodiments may provide one of the following effects or benefits. In particular, they may provide a highly efficient and/or robust cooling of electronic power modules. The electronic modules or packages may be easily mounted on external structures and/or may provide space saving solutions. In principle no limiting organic materials or layers may be necessary in order to provide for a good heat dissipation or discharge. The electronic modules may provide for an easy and well defined interface to the application in which it is used and/or well defined operation or performance parameters.

FIG. 1A schematically shows a cross sectional view of an electronic module 100 according to an exemplary embodiment. In particular, the electronic module 100 comprises an interposer 101 made of a ceramic material and including a fluid channel 102 formed therein. Furthermore, an electrically conductive structured layer 103, e.g. of copper, is directly formed (e.g. printed or sintered) on a body of the interposer 101. For example, a copper layer or foil may be printed on the ceramic material and may be afterwards structured by an etching process.

Alternatively, the form "generating" process (e.g. 3D printing) like laser printing may be performed to form the structured layer. Moreover, the electronic module 100 comprises a plurality of electronic chips or dies 104 attached to the structured layer 103 by bonding, soldering, adhesive layer or the like, schematically indicated by a layer 105 in FIG. 1A. Thus, the electronic chips are attached to the interposer as well.

As can be seen the interposer 101 comprises two main surfaces, an upper main surface and a bottom main surface, onto which a respective structured layer is formed (sintered) and each having a plurality of electronic chips attached thereto.

As described above the (ceramic) interposer comprises or forms side walls of the fluid channel 102 or hollow space through which a fluid cooling medium like water or oil may be guided, which is schematically indicated in FIG. 1A by arrow 106. In case of a simple hollow space some structures like cooling fins may project into the hollow space. The fluid channel comprises an input terminal 107 and an output terminal 108 which may be formed by the same (ceramic) material of the interposer or may be formed by another material. The input and output terminals may be formed on opposite sides (as shown in FIG. 1A) or on neighboring sides.

Furthermore, a molded encapsulation 109 is formed around the plurality of electronic chips and the fluid channel 102. Only external electrical connects (portions of a lead frame, for example; not shown in the cross section) and portions of the input terminal 107 and output terminal 108 are kept free of the molding material forming the encapsulation. The lead frame may be connected to the electrically conductive structured layer via wire and/or clip bonding.

Figure 1B:
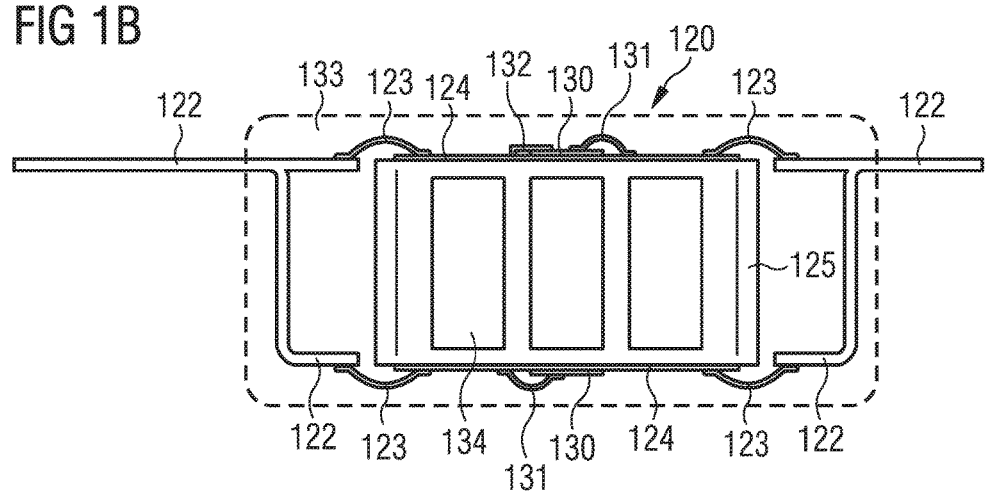
FIG. 1B schematically shows a cross sectional view of an electronic module according to an exemplary embodiment.

FIG. 1B schematically shows a cross sectional view of a similar electronic module 120 wherein the cross section is taken in a perpendicular direction to the one of FIG. 1A, i.e. perpendicular to the input and output terminals and intersecting fluid channels 134. Furthermore, lead frame portions 122 can be seen on the left side and the right side. These lead frame portions may be of different dimensions and may be used for logic signal paths and power paths, respectively. In addition bond wires 123 are shown connecting the lead frame portions with metallic structured layers 124 directly formed on a ceramic body 125.

Furthermore, electronic chips 130 are attached to both main surfaces of the interposer of FIG. 1B, in particular to respective metallic structured layers 124. The electronic chips may be clip bonded 132 or wire bonded 131 to the metallic structured layer 124, for example. It should be noted that preferably the electronic chips may be leveled with the lead frame portions as shown in FIG. 1B. For achieving the levelling the lead frame portions may be bend as shown in FIG. 1B. This levelling may lead to the fact that the bond wires 123 may be rather short, which may improve the performance of the electronic module. Furthermore, an encapsulation 133 is shown encapsulating the interposer and the electronic chips attached or bonded thereto. It should be noted that while several separated fluid channels 134 are shown in FIG. 1B also one fluid channel may be formed in the interposer, wherein the fluid channels substantially filling the complete interior of the interposer.

Figure 2A:
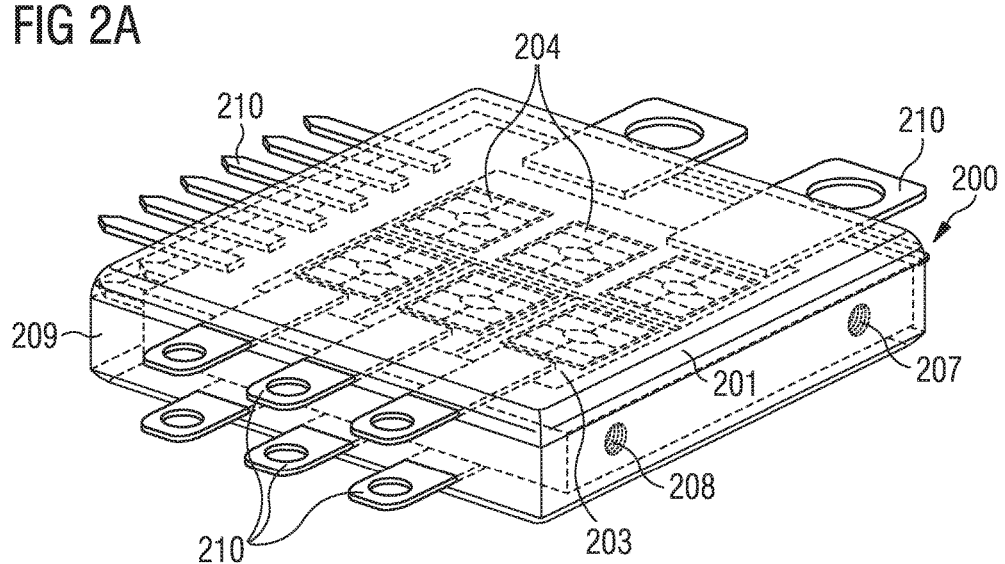
FIGS. 2A and 2B schematically show a perspective view of an electronic module according to an exemplary embodiment.
Figure 2B:
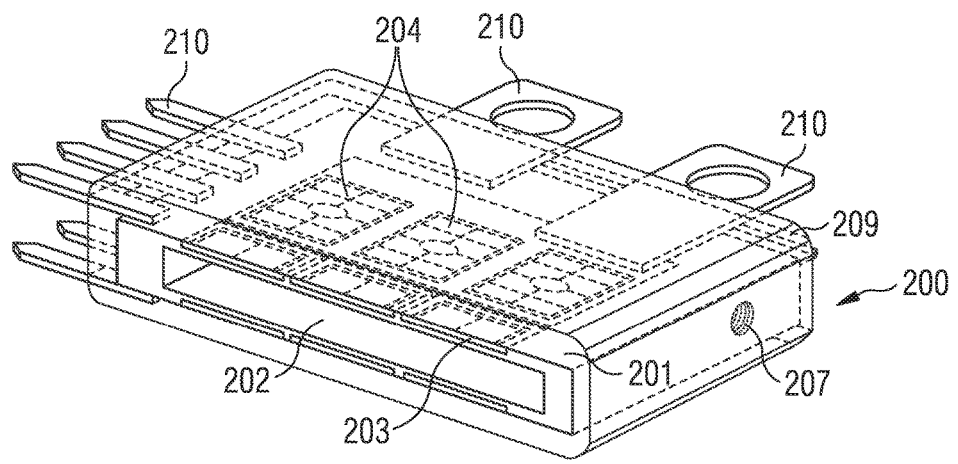

FIGS. 2A and 2B schematically show a perspective view of an electronic module 200 according to an exemplary embodiment, wherein FIG. 2B represents a cross sectional view of the electronic module of FIG. 2A. In particular, the electronic module 200 comprises (a body of) an interposer 201 made of a ceramic material and forming a hollow space or a fluid channel 202 therein (cf. FIG. 2B). Furthermore, an electrically conductive structured layer 203 is directly formed or sintered onto a body of the interposer 201.

Moreover, the electronic module 200 comprises a plurality of electronic chips or dies 204 attached to the structured layer 203 by bonding, e.g. soldered. Thus, the electronic chips are attached to the interposer as well.

As can be seen the interposer 201 forms a hollow space therein and having an upper and a lower main surface and each having a plurality of electronic chips attached thereto.

Through the hollow space a fluid cooling medium like water may be guided. The fluid channel comprises an input terminal 207 and an output terminal 208 which may be formed by respective holes in the interposer in fluid communication with the hollow space in the interposer 201.

Furthermore, a molded encapsulation 209 is formed around the plurality of electronic chips and the fluid channel 202. Only external electrical connects 210 (portions of lead frame, for example) are kept free of the molding material forming the encapsulation.

FIG. 3 illustrates a flowchart of a method of manufacturing an electronic module 300 according to an exemplary embodiment. In particular, the method comprises providing an interposer comprising a fluid channel formed in an electrically isolating material and an electrically conductive structured layer, wherein the electrically conductive structured layer is directly formed on the electrically isolating material (step 301). Furthermore, at least one electronic chip is attached to the electrically conductive structured layer and in thermal contact to the fluid channel (step 302). In addition, an encapsulation is molded at least partially around the at least one electronic chip.

In general the manufacturing method may be based on lead frame mounting concepts and may include the forming of a (for heat dissipation) stack of layers including a conductive layer (like copper) used for spreading heat, an isolation layer (e.g. ceramic) forming a cooling channel or cooling body (e.g. a hollow space including cooling fins) and encapsulated by a molding material forming a housing of the electronic module. In particular, the ceramic material defining the hollow space may form an interposer as well. Thus, a heat dissipation stack having only a very small number of layers, e.g. conductive layer (Cu), isolation layer (ceramic) and hollow space (or the cooling fluid flowing through the hollow space) may be provided.

FIGS. 4A to 4F show schematic perspective views illustrating a manufacturing process of an electronic module 400 after different steps according to an exemplary embodiment.

Figure 4A:
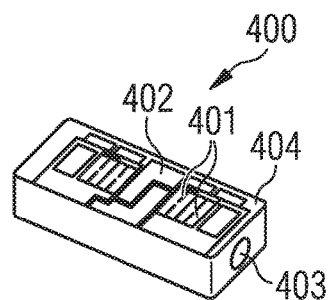
FIGS. 4A to 4F show schematic perspective views illustrating different steps of a manufacturing method according to an exemplary embodiment.
Figure 4B:
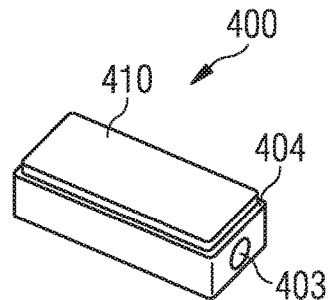

In particular, FIG. 4A shows the process of manufacturing an electronic module 400 after one or several electronic chip(s) or die(s) 401 are attached to an electrically conductive structured layer 402 which is directly formed on an electrically isolating material 404 of an interposer. In the interposer body a fluid channel is formed which is indicated by the input terminal 403. FIG. 4B schematically shows the process after an (inner) encapsulation 410 is formed on the die(s), which may be formed by a molding material or compound, resin, glass, laminates, plastic or any other suitable material.

Figure 4C:
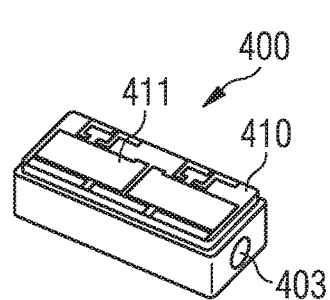
Figure 4D:
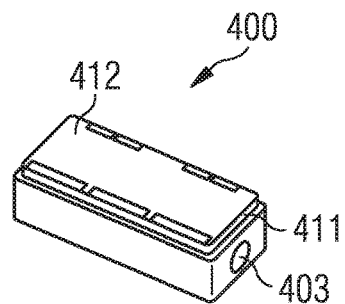
Figure 4E:
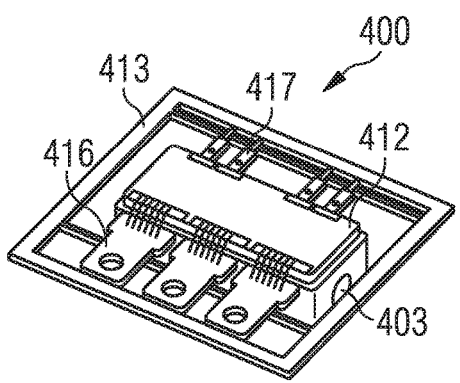
Figure 4F:
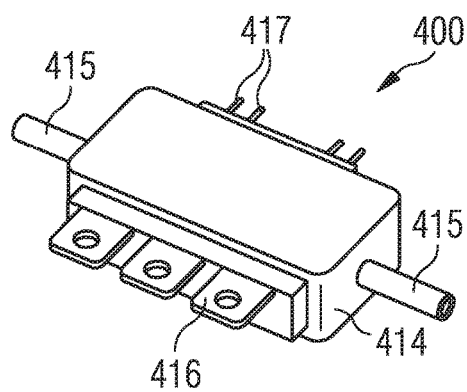

FIG. 4C schematically shows the process after a metallization 411 and/or vias are formed on or in (inner) encapsulation 410 onto which a solder resist layer 412 is formed which is shown in FIG. 4D. Before forming the metallization a seed layer may be formed and/or a thermal activation step may be performed. In a next step a leadframe 413 may be attached to the solder resist layer, which is schematically shown in FIG. 4E. As can be seen in the FIG. 4E dimensions of the leads of the leadframe may be different, e.g. broader lead 416 may be used for conducting power while narrower and/or thinner leads may be used for conducting control or logic signals. FIG. 4F schematically shows the manufactured electronic module after an (outer) encapsulation 414 is formed and fluid terminals 415 are attached or arranged on or in the (outer) encapsulation 414 and being in fluid communication to the (not shown) fluid channel. While the fluid terminals are shown to be attached to or formed in opposite sides of the encapsulation or the interposer it goes without saying that they may be arranged in the same side or on neighboring sides as well.

Figure 5A:
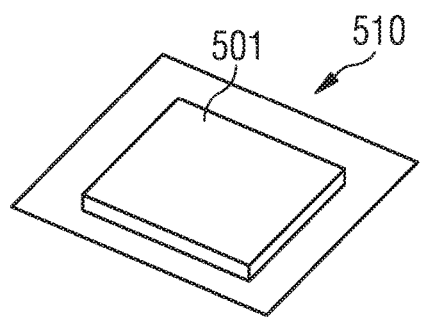
FIGS. 5A to 5F show schematic perspective views illustrating different steps of a manufacturing method according to another exemplary embodiment.
Figure 5B:
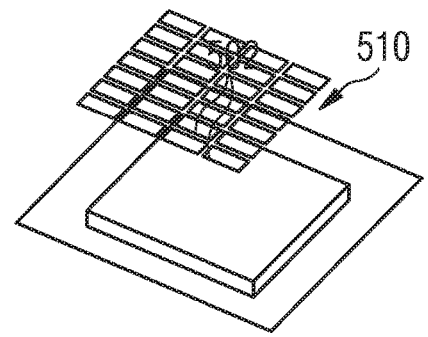
Figure 5C:
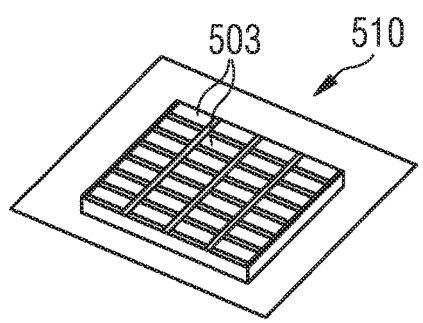

FIGS. 5A to 5F show schematic perspective views illustrating a manufacturing process of an electronic module 500 after different steps according to another exemplary embodiment. In contrast to FIG. 4, FIG. 5 illustrates a manufacturing process in which a panel or multiblock including an array of electronic chips 510 is used. In particular, FIG. 5A shows an array of electronic chips or dies encapsulated by an (inner) encapsulation 501 and forming a panel. FIG. 5B shows the process of FIG. 5 after a (galvanic) redistribution layer 502 is formed on the array encapsulation, onto which a solder resist layer 503 is formed or arranged as shown in FIG. 5C. For example, the redistribution layer may be formed by a so-called pattern plating process.

Figure 5D:
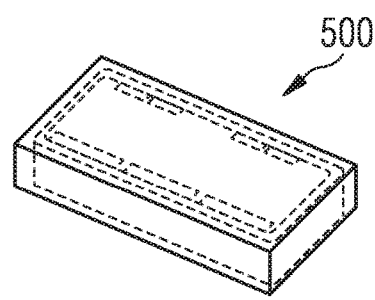
Figure 5E:
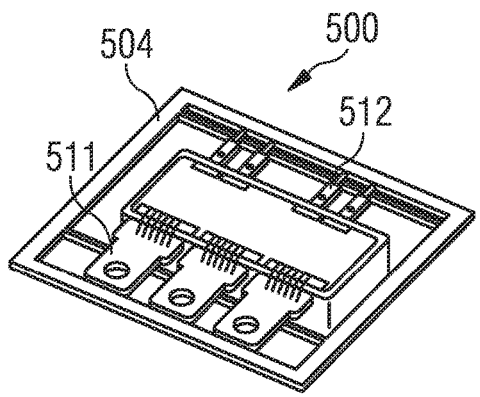
Figure 5F:
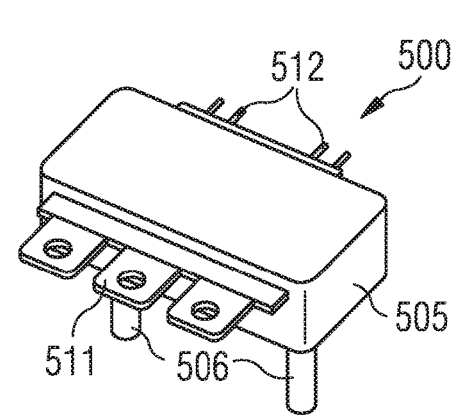

FIG. 5D shows the process of FIG. 5 after a singularization step, i.e. after the panel has been diced so that a body of a single electronic module 500 has been formed. In a next step a leadframe 504 may be attached to the solder resist layer 503, which is schematically shown in FIG. 5E. As in FIG. 4 the dimensions of leads of the leadframe may be different, e.g. broader leads 511 may be suited for power signals, while narrower leads 512 may be suited for logic signals. FIG. 5F schematically shows the manufactured electronic module 500 after an (outer) encapsulation 505 is formed and fluid terminals 506 are attached or arranged on or in the (outer) encapsulation 505 and being in fluid communication to the (not shown) fluid channel. While the fluid terminals are shown to be attached to or formed in one common side of the encapsulation or the interposer it goes without saying that they may be arranged in the opposite side or on neighboring sides as well.

According to specific embodiments an electronic module is provided having an improved reliability due to reduced mechanical or thermal stress during power cycles of the electronic module. This reduction of stress may be due to the fact that the (metallic) structured layer to which the electronic chip is attached is sintered partially into or at least together with a ceramic body of the interposer. Thus, it may be possible to on the one hand achieve reliable connection between the ceramic body of the interposer and the structured layer and on the other hand a pore size of the material of the structured layer may be in a suitable range for ensuring low stress between the structured layer and the ceramic material of the interposer body.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic module comprising:
    an interposer comprising a fluid channel formed in an electrically isolating material and an electrically conductive structured layer;
    at least one electronic chip attached to the electrically conductive layer and in thermal contact to the fluid channel; and
    a molded encapsulation formed at least partially around the at least one electronic chip,
    wherein the electrically conductive structured layer is directly formed on the electrically isolating material,
    wherein the interposer comprises a ceramic material,
    wherein the electrically conductive structured layer comprises a metal and is sintered together with the ceramic material.

2. The electronic module according to claim 1, further comprising a further electronic chip, wherein the at least one electronic chip is arranged on a first main surface of the interposer and the further electronic chip is arranged on a second main surface of the interposer.

3. The electronic module according to claim 1, wherein the at least one electronic chip is attached to the electrically conductive structure layer by a sintering process.

4. The electronic module according to claim 1, further comprising an external electrical contact connected to the electrically conductive structured layer and being partially embedded into the molded encapsulation.

5. The electronic module according to claim 1, wherein the electronic chip is connected to the electrically conductive structured layer by a bonding process selected out of the group consisting of:
    wire bonding;
    clip bonding;
    laser welding;
    soldering;

resistance welding; and ultrasonic welding.

6. The electronic module according to claim 1, wherein the molded encapsulation comprises surface structures configured to fix the electronic module to an external structure.

7. The electronic module according to claim 6, wherein the surface structure has a form selected out of the group consisting of:

groove;

tongue;

screw hole;

rivet;

screw; and recess.

8. The electronic module according to claim 1, further comprising a fixation element embedded in the molded encapsulation.

9. The electronic module according to claim 1, wherein the at least one electronic chip is one out of the group consisting of:

power transistor;

power diode; and logic components.

10. The electronic module according to claim 1, further comprising a passive electric component at least partially embedded in the molded encapsulation.

11. The electronic module according to claim 1, wherein the electrically conductive structured layer comprising portions of different dimensions.

12. The electronic module according to claim 1, wherein the encapsulation comprises an encapsulant and a filler material.

13. The electronic module according to claim 1, further comprises a redistribution layer.

* * * * *